(12) United States Patent
Likhanskii et al.

(10) Patent No.: US 10,937,624 B2
(45) Date of Patent: Mar. 2, 2021

(54) APPARATUS AND METHOD FOR CONTROLLING ION BEAM USING ELECTROSTATIC FILTER

(71) Applicant: APPLIED Materials, Inc., Santa Clara, CA (US)

(72) Inventors: Alexandre Likhanskii, Malden, MA (US); Frank Sinclair, Boston, MA (US); Shengwu Chang, South Hamilton, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 18 days.

(21) Appl. No.: 16/197,249

(22) Filed: Nov. 20, 2018

(65) Prior Publication Data
US 2020/0161078 A1    May 21, 2020

(51) Int. Cl.
*H01J 37/147*    (2006.01)
*H01J 37/08*    (2006.01)
*H01J 37/12*    (2006.01)
*H01J 37/317*    (2006.01)

(52) U.S. Cl.
CPC .............. *H01J 37/08* (2013.01); *H01J 37/12* (2013.01); *H01J 37/147* (2013.01); *H01J 37/3171* (2013.01); *H01J 2237/053* (2013.01); *H01J 2237/057* (2013.01)

(58) Field of Classification Search
None
See application file for complete search history.

(56) References Cited

U.S. PATENT DOCUMENTS 6,326,631 B1 * 12/2001 Politiek ............... H01J 37/3171
                                                  250/396 R
6,573,517 B1    6/2003 Sugitani et al.
7,022,984 B1    4/2006 Rathmell et al.
(Continued)

FOREIGN PATENT DOCUMENTS

JP    2010123547 A    6/2010
JP    2015191740 A    11/2015
(Continued)

OTHER PUBLICATIONS

International Search Report and Written Opinion dated Apr. 28, 2020, for the International Patent Application No. PCT/US2019/059075, filed on Oct. 31, 2019, 8 pages.
(Continued)

*Primary Examiner* — James Choi
(74) *Attorney, Agent, or Firm* — Kacvinsky Daisak Bluni PLLC

(57) ABSTRACT

An apparatus is provided. The apparatus may include a main chamber, an entrance tunnel, the entrance tunnel having an entrance axis extending into the main chamber; an exit tunnel, connected to the main chamber and defining an exit axis, wherein the entrance tunnel and the exit tunnel define a beam bend of less than 25 degrees therebetween, and an electrode assembly, disposed in the main chamber, and defining a beam path between the entrance tunnel and the exit tunnel. The electrode assembly may include an upper electrode, disposed on a first side of the beam path, and a plurality of lower electrodes, disposed on a second side of the beam path, the plurality of lower electrodes comprising at least three electrodes.

19 Claims, 7 Drawing Sheets

(56) References Cited

U.S. PATENT DOCUMENTS

| | | |
|---|---|---|
| 7,326,941 B2 | 2/2008 | Chen et al. |
| 7,888,653 B2 | 2/2011 | Kellerman et al. |
| 8,129,695 B2 | 3/2012 | Kellerman et al. |
| 8,389,964 B2 | 3/2013 | Igo et al. |
| 9,293,295 B2 | 3/2016 | Yagita |
| 2004/0013820 A1 | 1/2004 | Cadieu |
| 2009/0189096 A1* | 7/2009 | Chen .................. H01J 37/3171 250/492.21 |
| 2010/0065761 A1 | 3/2010 | Graf et al. |
| 2010/0171042 A1* | 7/2010 | Kellerman .......... H01J 37/3171 250/396 R |
| 2011/0163229 A1 | 7/2011 | Frosien et al. |
| 2012/0104273 A1 | 5/2012 | Ryding et al. |
| 2012/0168637 A1 | 7/2012 | Radovanov et al. |
| 2013/0119263 A1 | 5/2013 | Smick et al. |
| 2015/0279612 A1 | 10/2015 | Yagita |
| 2015/0380206 A1 | 12/2015 | White et al. |
| 2016/0111245 A1* | 4/2016 | Saadatmand ............ H05H 7/12 250/424 |
| 2016/0189912 A1* | 6/2016 | Eisner .................... H01J 37/12 250/282 |
| 2018/0218894 A1 | 8/2018 | Likhanskii |
| 2019/0259560 A1 | 8/2019 | Chang et al. |

FOREIGN PATENT DOCUMENTS

| | | |
|---|---|---|
| KR | 10-20120116451 A | 10/2012 |
| WO | 2007013869 A1 | 2/2007 |
| WO | 2013106220 A1 | 7/2013 |

OTHER PUBLICATIONS

International Search Report and Written Opinion dated Apr. 9, 2020, for the International Patent Application No. PCT/US2019/059067, filed on Oct. 31, 2019, 9 pages.

International Search Report and Written Opinion dated Apr. 9, 2020, for the International Patent Application No. PCT/US2019/059069, filed on Oct. 31, 2019, 10 pages.

International Search Report and Written Opinion dated Apr. 9, 2020, for the International Patent Application No. PCT/US2019/059079, filed on Oct. 31, 2019, 7 pages.

\* cited by examiner

APPARATUS AND METHOD FOR CONTROLLING ION BEAM USING ELECTROSTATIC FILTER

FIELD OF THE DISCLOSURE

The disclosure relates generally to apparatus and techniques for implanting substrates, and more particularly, to improved energy filters for ion beams.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens and an electrostatic filter to control ion beam energy, ion beam shape, and ion beam size. The electrostatic module may accelerate or decelerate an ion beam to a final energy, while altering the direction of propagation of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The rod/electrode potentials are set to create electric fields in the electrostatic module causing the ion beam to decelerate, deflect and focus the ion beam.

In some configurations of electrostatic modules, a given number of electrodes, such as five or seven pairs of electrodes may be used to deflect, decelerate, and focus ion beam before in a main chamber of the electrostatic module before exiting at a final beam energy before striking a substrate. To maintain electrodes in proper working order, periodic maintenance may be performed to clean the main chamber as well as electrodes, to remove debris, such as flakes, or other material accumulating during use of the electrostatic module. For example, material from the substrate may be resputtered during implantation, and may be transported back onto surfaces of electrodes or other surfaces within the electrostatic module. Such material may accumulate on electrodes in a manner promoting flaking or other erosion of material, which eroded material may in part transport onto the substrate as atomic level, microscopic or macroscopic particles or debris.

With respect to these and other considerations the present disclosure is provided.

BRIEF SUMMARY

In one embodiment, an apparatus is provided. The apparatus may include a main chamber, an entrance tunnel, the entrance tunnel having an entrance axis extending into the main chamber, and an exit tunnel, connected to the main chamber and defining an exit axis. The entrance tunnel and the exit tunnel may define a beam bend of less than 25 degrees therebetween. The apparatus may include an electrode assembly, disposed in the main chamber, and defining a beam path between the entrance tunnel and the exit tunnel. The electrode assembly may comprise an upper electrode, disposed on a first side of the beam path, and a plurality of lower electrodes, disposed on a second side of the beam path, the plurality of lower electrodes comprising at least three electrodes.

In a further embodiment, a method of controlling an ion beam is provided. The method may include conducting the ion beam into a chamber along a first beam trajectory, the ion beam being at a first potential. The method may include deflecting the ion beam in a first direction, while accelerating the ion beam to a second potential, and deflecting the ion beam in a second direction, opposite the first direction, while decelerating the ion beam to a third potential. Thus, the ion beam may exit the chamber along a second beam trajectory, different from the first beam trajectory.

In another embodiment, an ion implanter may include an ion source to generate an ion beam, and an electrostatic filter, disposed downstream to the ion source, to control the ion beam. The electrostatic filter may include an entrance tunnel, where the entrance tunnel has an entrance axis extending into a main chamber of the electrostatic filter. The electrostatic filter may include an exit tunnel, connected to the main chamber and defining an exit axis, wherein the entrance tunnel and the exit tunnel define a beam bend of less than 25 degrees therebetween. The ion implanter may include an electrode assembly, disposed in the main chamber, and defining a beam path between the entrance tunnel and the exit tunnel, wherein the electrode assembly is disposed on a lower side of the entrance tunnel.

Figure 1:
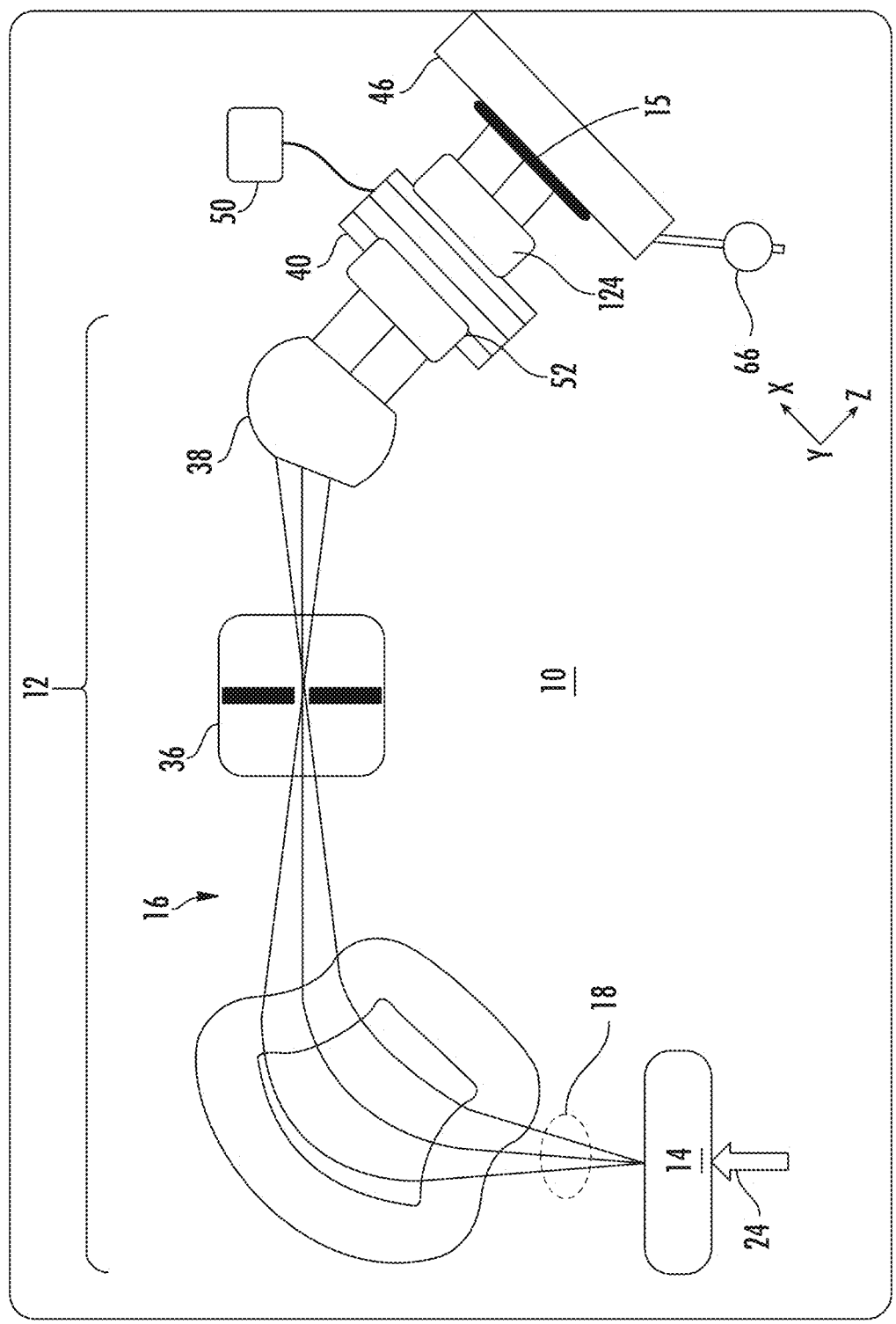
FIG. 1 shows an exemplary embodiment demonstrating an ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation and reliability of an electrostatic module acting as an electrostatic filter, for example. In exemplary embodiments, an electrostatic filter is disclosed having a novel architecture, including novel arrangement of an electrode assembly in a main chamber of the electrostatic module.

Referring now to FIG. 1, an exemplary embodiment demonstrating a system 10 is shown, where the system 10 may be used for ion implantation system in accordance with the present disclosure. The system 10 includes, among other components, an ion source 14 for producing an ion beam 18, such as a ribbon ion beam or a spot beam, and a series of beam-line components. The ion source 14 may comprise a chamber for receiving a flow of gas 24 and generates ions. The ion source 14 may also comprise a power source and an extraction electrode assembly disposed near the chamber. The beamline extending from the ion source 14 to an electrostatic filter 40 may be deemed an upstream beamline 12. In some non-limiting embodiments, the beam-line components 16 of the upstream beamline may include, for example, a mass analyzer 34, a first acceleration or deceleration stage 36, and a collimator 38, disposed upstream of the electrostatic filter 40, which filter may provide deceleration and/or acceleration or the ion beam 18.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate 15 mounted on a platen or clamp within a process chamber 46. The substrate may be moved in one or more dimensions (e.g., translate, rotate, and tilt).

The electrostatic filter 40 is a beam-line component configured to independently control deflection, deceleration, and focus of the ion beam 18. In some embodiments, the electrostatic filter 40 is a vertical electrostatic energy filter (VEEF) or electrostatic filter EF. As will be described in greater detail below, the electrostatic filter 40 may be arranged as an electrode assembly defining at least one electrode configuration. The electrode configuration may include a plurality of electrodes arranged in series along the beamline to process the ion beam 18 through the electrostatic filter 40. In some embodiments, the electrostatic filter may include at least one upper electrode disposed above the ion beam 18 and a set of lower electrodes disposed below the ion beam 18. A difference in potentials between the at least one upper electrode and the set of lower electrodes may also be varied along the central ion beam trajectory to deflect the ion beam at various points along the central ray trajectory (CRT). The system 10 may further include an electrode voltage supply, shown as electrode voltage assembly 50, as well as an entrance tunnel 52, coupled to the electrostatic filter 40, where the operation of the tuner voltage assembly is described below.

As further shown in FIG. 1, the system 10 may include an entrance tunnel 52, arranged just upstream of the electrostatic filter 40, or forming an upstream portion of the electrostatic filter 40, to guide the ion beam 18 into the electrostatic filter 40. The system 10 may further include an exit tunnel 124, arranged just downstream of a main chamber of the electrostatic filter 40, or forming a portion of the electrostatic filter 40. As disclosed in the embodiments to follow, the entrance tunnel 52, exit tunnel 124, and electrodes within the electrostatic filter 40 may be arranged in a novel configuration to improve operation of the system 10.

In accordance with embodiments of the disclosure, the electrostatic filter 40 may be arranged for beamline operation over a wide range of conditions, from relatively lower to higher beam currents, from relatively lower to higher beam energies. In accordance with various embodiments, discussed below, the electrostatic filter 40 may be arranged wherein the entrance tunnel and the exit tunnel are aligned to define a beam bend of 25 degrees or less therebetween. This low beam bend arrangement facilitates adaptation with many known beamline designs.

Figure 2:
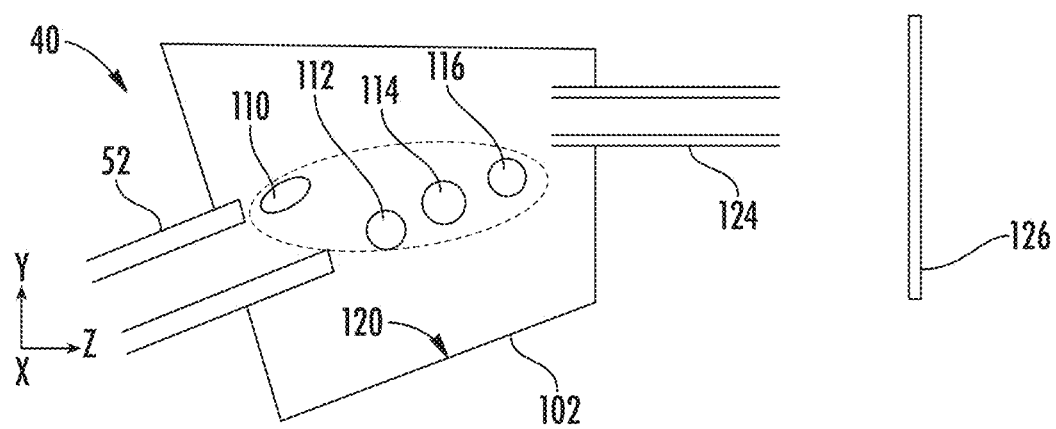
FIG. 2 shows an exemplary embodiment of an electrostatic filter in cross-section, according to embodiments of the disclosure.

Referring now to FIG. 2, the structure of one variant of the electrostatic filter 40 is shown. In FIG. 2, there is shown a side cross-sectional view the electrostatic filter 40, entrance tunnel 52, and exit tunnel 124. As shown, the electrostatic filter 40 includes a main chamber 102, extending above and partially encasing electrostatic filter 40. The electrostatic filter 40 includes electrode assembly 108, including electrode 110, electrode 112, electrode 114, and electrode 116. As shown in FIG. 2, the plurality of electrodes are arranged in an asymmetric configuration. For example, in the specific embodiment shown in FIG. 2, the electrode assembly 108 comprises just one upper electrode, shown as electrode 110. In some embodiments, the upper electrode may comprise an elongated cross-section, as shown in FIG. 2.

The provision of an elongated cross-section, allows the upper electrode to be relatively thin along a vertical direction, to remain out of the line of sight from the substrate. At the same time, the elongation, generally along the horizontal direction allows the upper electrode to bend an incoming beam without requiring excessively high voltage. In addition, the elongated cross-section may have rounded corners as shown to minimize electrostatic stresses.

As further shown in FIG. 2, the electrode assembly 108 is disposed just on the lower side of the exit tunnel 124. The electrode assembly 108 may further be arranged so the "upper electrode," meaning the electrode 110, is disposed well below the exit tunnel 124. In some embodiments, the upper electrode of an electrode assembly is disposed at a first distance below the exit tunnel 124, where a last electrode of the plurality of lower electrodes (see electrode 116) is disposed at a second distance below the entrance tunnel, less than the first distance. This configuration places the upper electrode further below the exit tunnel 124 than the nearest lower electrode, helping further reduce contamination, as discussed below.

In various embodiments, the entrance tunnel 52 may be configured having an asymmetric structure, where a lower portion of the entrance tunnel 52 extends into the main chamber 102 to a further extent than the upper portion, as illustrated in FIG. 2. This configuration allows placement of the electrode 110, closer to the entrance side of the main chamber 102, which placement may be advantageous in shaping and transporting ion beams through the electrostatic filter 40, discussed below.

Figure 3A:
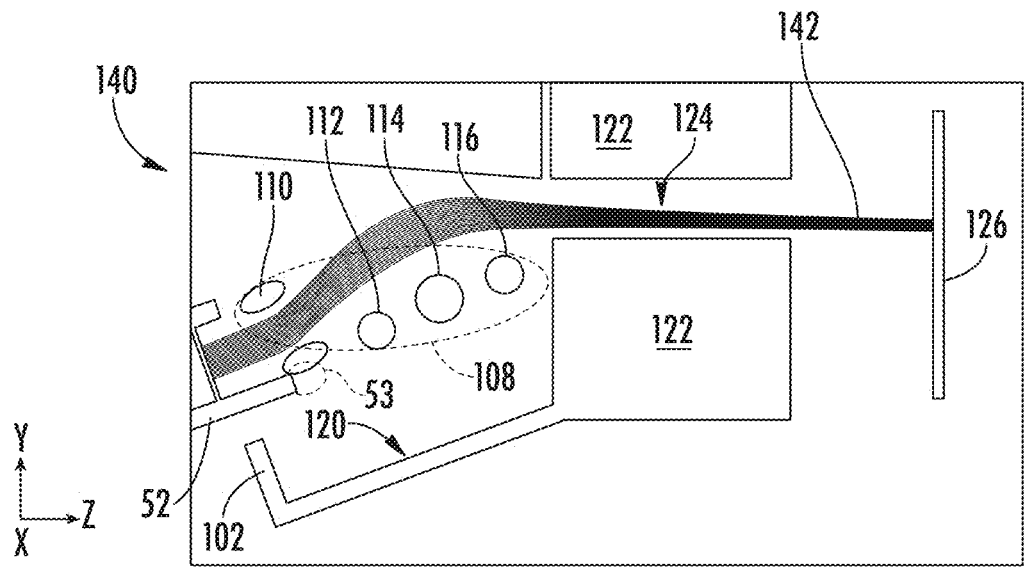
FIGS. 3A-3B show an electrostatic filter, in two different modes of operation for transporting an in beam, according to exemplary embodiments of the disclosure.
Figure 3B:
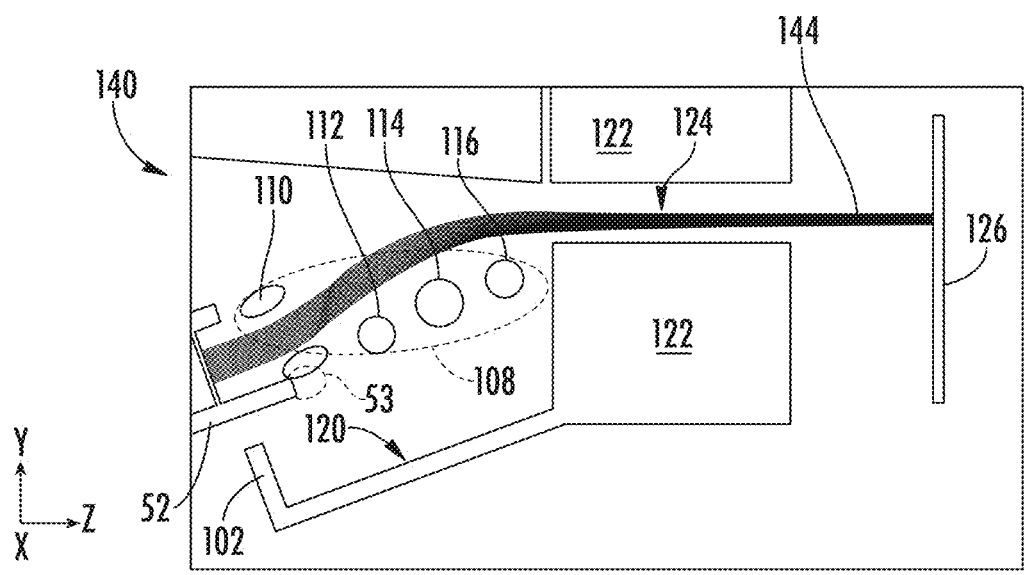

FIGS. 3A-3B show the operation of one variant of the electrostatic filter 40 shown as electrostatic filter 140. The operation is shown for two different modes of operation, where in FIG. 3A, the electrostatic filter 140 is operated for a relatively lower beam energy, while in FIG. 3B, the electrostatic filter 140 is operated at a relatively higher beam energy. The electrostatic filter 140 further includes a plasma flood gun 122, disposed adjacent the main chamber 102 and containing the exit tunnel 124. The plasma flood gun 122 may be arranged to operate according to the principles of known plasma flood guns.

FIG. 3A shows a simulation of the transport of a low energy phosphorus ion beam is shown, wherein the ion beam 142 has a final beam energy of 3 kV. In this simulation, and others to follow in the succeeding figures, the entrance tunnel 52 is arranged with an asymmetric structure where the lower side extends further into the main chamber 102 than the upper side. For the purposes of simulation, the lower side is shown as having a rounded protuberance (solid line), while in practical embodiments, the lower side may exhibit a distal end 53, rounded, as shown in the dashed lines.

In particular, in the simulation of FIG. 3A, the ion beam 142 is conducted into the main chamber 102 of the electrostatic filter 140 with an initial ion potential of 28 kV and, after being processed in the electrostatic filter 140, is conducted to the substrate 126 at a final ion energy of 3 kV. The ion beam 142 is conducted through the entrance tunnel 52 and into the main chamber 102 along a first beam trajectory, forming an angle of approximately 20 degrees with respect to horizontal (X-Y plane) in this simulation. The ion beam 142 exits the main chamber 102 along a second beam trajectory, different from the first beam trajectory, such as along the horizontal, as shown in FIG. 3A. Thus, a low beam bend is defined between the first trajectory and second trajectory, in this case a beam bead of 20 degrees. This configuration allows the electrostatic filter 140 to be inserted into beamlines where the relative placement of beamline components such as collimator 38 and substrate 15 calls for a relatively small deviation in beam trajectory when processed through an electrostatic filter.

As further shown in FIG. 3A, the ion beam 142 is deflected in a first direction (to the left or upwardly) after entering the main chamber 102, and is subsequently deflected in a second direction (to the right or downwardly) before exiting the main chamber.

In the simulation of FIG. 3B, the ion beam 142 is an arsenic (As+) ion beam, conducted into the main chamber 102 of the electrostatic filter 140 with an initial potential of 60 kV and, after being processed in the electrostatic filter 140, is conducted to the substrate 126 at a final potential of 60 kV. The ion beam 142 is conducted through the entrance tunnel 52 and into the main chamber 102 along a first beam trajectory, and second beam trajectory similar to the case of FIG. 3A. In both these simulations, a 32 mA current is transported through the electrostatic filter 140 to the substrate 126.

Figure 4A:
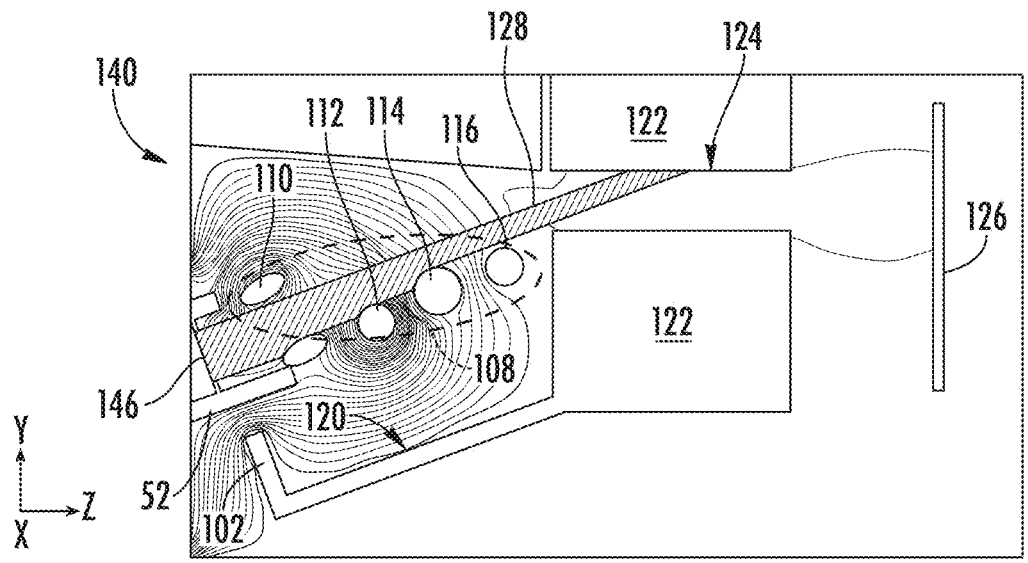
FIG. 4A and FIG. 4B illustrate simulations of electrostatic potential and energetic neutral distribution in an exemplary electrostatic filter under two different modes of operation, according to embodiments of the disclosure.
Figure 4B:
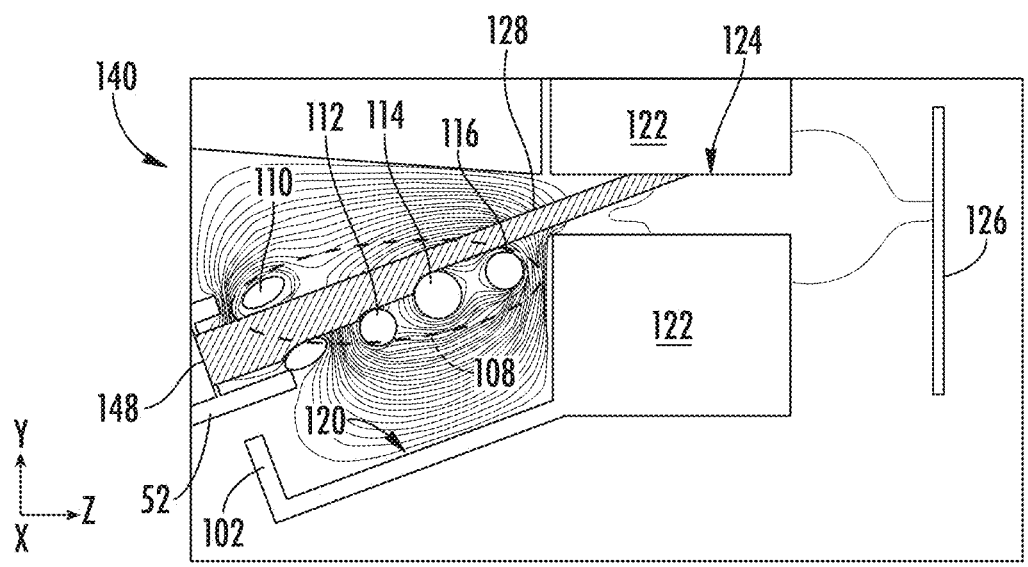

FIGS. 4A and 4B show the simulation of electrostatic potential and energetic neutral trajectories corresponding to the operation conditions of FIG. 3A and FIG. 3B, respectively. In FIG. 4A, the chamber walls 120 and the exit tunnel 124, as well as electrode 116, are set at ground potential, while the electrode 110, electrode 112, and electrode 114 are set at negative potential. In FIG. 4B, the chamber walls 120 and the exit tunnel 124 is set at ground potential, while the electrode 110, electrode 112, electrode 114, and electrode 116 are set at negative potential.

The neutral flux 146 and neutral flux 148 represents the paths of energetic neutrals entering the main chamber 102, having an energy comparable to the initial beam energy of the ion beam 142 or ion beam 144, respectively. As shown, because the energetic neutrals are not influenced by the electric fields generated by the varying electrostatic potential, the energetic neutrals travel in straight trajectories and are intercepted by the upper portion of the exit tunnel 124, as well as by portions of the electrodes.

Figure 5A:
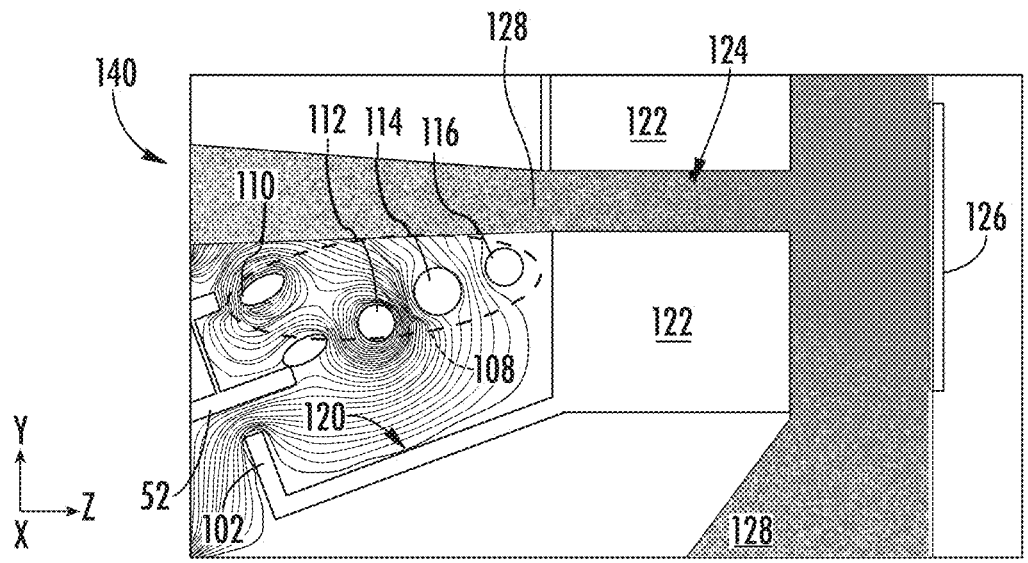
FIG. 5A and FIG. 5B illustrate simulations of sputtered particle distribution in an exemplary electrostatic filter under two modes of operation, according to other embodiments of the disclosure.
Figure 5B:
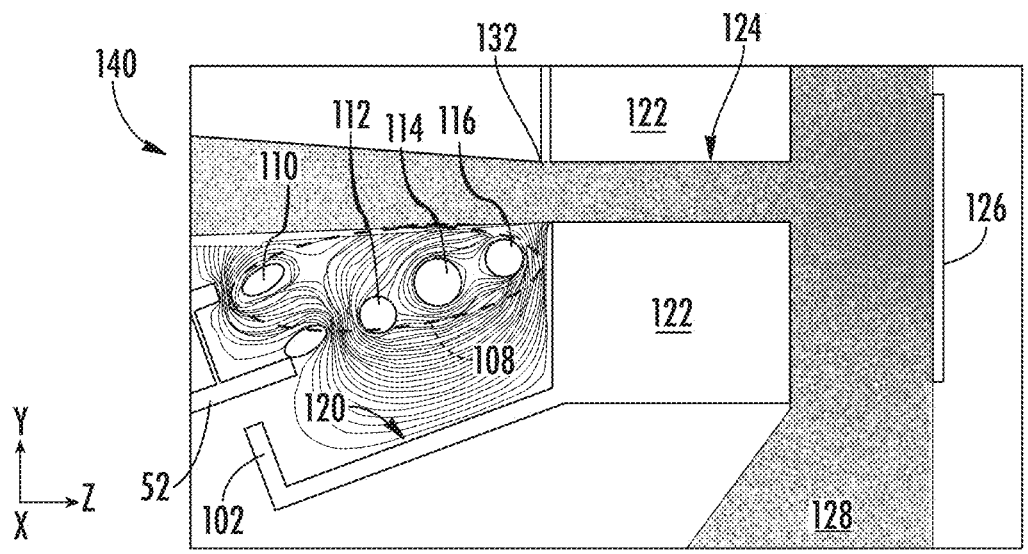

Turning now to FIG. 5A and FIG. 5B a pair of simulations is shown to simulate the two-dimensional spatial distribution of sputtered material 130 and sputtered material 132, ejected from the substrate 126, under the conditions of FIG. 3A and FIG. 3B, respectively. The sputtered material represents material initially disposed at the substrate 126, where an incident ion beam used to implant ions into the substrate 126 may resputter a certain amount of material located on or near the surface of the substrate 126. Turning in particular to FIG. 5A, the incident ion beam is a phosphorous ion beam having an energy of 3 keV, while in FIG. 5B, the incident ion beam is an arsenic ion beam having an energy of 60 keV.

The simulation of FIG. 5A illustrates resputtered material may be ubiquitous in the downstream region 128, located between the plasma flood gun 122 and the substrate 126. In addition, the exit tunnel 124, defined by the plasma flood gun 122, is replete with resputtered particles, indicating the particles travel back from the substrate 126 toward the main chamber 102 of the electrostatic filter 140.

As further shown in FIG. 5A, the simulation of resputterred particles forms a dense plume within the main chamber 102, aligned with the exit tunnel 124, wherein most of the resputterred particles remain in the top portion of the main chamber 102, above the exit tunnel. The plume of sputtered particles may then land at various locations of the chamber walls 120 of the main chamber 102. In this simulation, in no cases do resputtered particles land on electrodes of the electrode assembly 108. Thus, the configuration of FIG. 5A is unlikely to accumulate any resputtered material on electrodes of the electrode assembly 108, at least by direct resputtering from the substrate 126.

The simulation of FIG. 5B also illustrates resputtered material may be ubiquitous in the downstream region 128, located between the plasma flood gun 122 and the substrate 126. In addition, the exit tunnel 124, defined by the plasma flood gun 122, is replete with resputtered particles, indicating the particles travel back from the substrate 126 toward the main chamber 102 of the electrostatic filter 140.

As further shown in FIG. 5B, the simulation of resputterred particles forms a dense plume within the main chamber 102, aligned with the exit tunnel 124, wherein most of the resputterred particles remain in the top portion of the main chamber 102, above the exit tunnel. The plume of sputtered particles may then land at various locations of the chamber walls 120 of the main chamber 102. In this simulation, in no cases do resputtered particles land on electrodes of the electrode assembly 108. Thus, the configuration of FIG. 5B is unlikely to accumulate any resputtered material on electrodes of the electrode assembly 108, at least by direct resputtering from the substrate 126.

Figure 6:
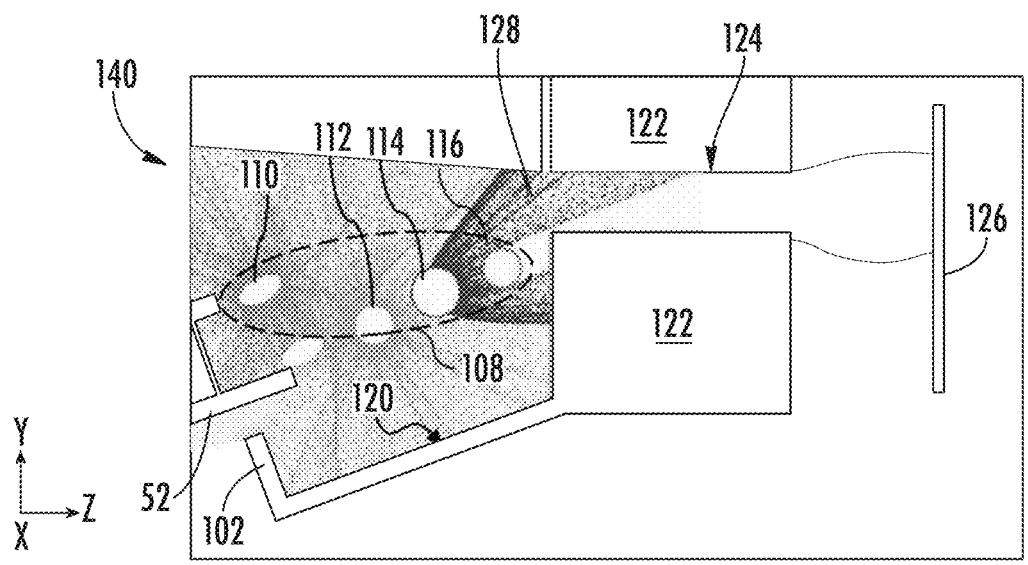
FIG. 6 illustrates simulations of negative particle distribution in an exemplary electrostatic filter under one mode of operation, according to further embodiments of the disclosure.

Turning now to FIG. 6, there is shown a further simulation of the variant of the electrostatic filter 40 of FIG. 3A. Specifically, FIG. 6 depicts trajectories of negatively charged particles leaving from the electrodes of the electrode assembly 108. The trajectories of negatively charged particles tend to lead away from a given electrode, forming a complex pattern, dependent upon the individual voltages applied to the different electrodes. Notably, none of negative charged particle trajectories lead to the substrate 126, due to the shielding provided by the geometry of the exit tunnel 124 with respect to the positions of the electrodes of electrode assembly 108.

Moreover, when the electrostatic filter 140 is operated in a deceleration mode, decelerating a positive ion beam from an initial energy to a lower final energy, positive particle trajectories are produced by the electrode assembly 108.

In accordance with various embodiments, the electrodes of electrode assembly 108 may be rods or other structures, elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context.

The specific configuration of electrodes of FIG. 4A-3C, where one electrode is arranged on one side of the beam path and three electrodes are arranged on an opposite side of the beam path may be especially appropriate for low to moderate final ion beam energy. For example, these configurations may be suitable for operation below 50 keV, where relatively lower voltages and electrostatic stresses may be present on electrodes, allowing fewer electrodes, such as just three electrodes to be used for decelerating and steering an ion beam. This fewer number of electrodes allows a more compact main chamber design, still effective in "hiding" electrodes from resputtered substrate material, and conversely, from generating unwanted negatively charged particles capable of striking the substrate.

Moreover, while the above embodiments illustrate configurations having three electrodes on one side of a beam path, in other configurations, four electrodes, five electrodes, or more may be arranged on one side of the beam path. Additionally, while the above embodiments show just one electrode on the opposite side of the beam path, in other embodiments, more than one electrode may be arranged on the opposite side of the beam path.

In addition, configurations are possible where the electrodes are arranged to define a steeper beam bend, such as 60 degrees, 70 degrees, 80 degrees, or 90 degrees, or a lower beam bend, such as 30 degrees. In these other configurations the arrangement of the shape of the main chamber, the position of electrodes and the location of the exit tunnel may be such to prevent or substantially reduce resputtered particles from the substrate from striking the electrodes, and to prevent or reduce negatively charged particles from exiting electrodes and striking the substrate.

Figure 7:
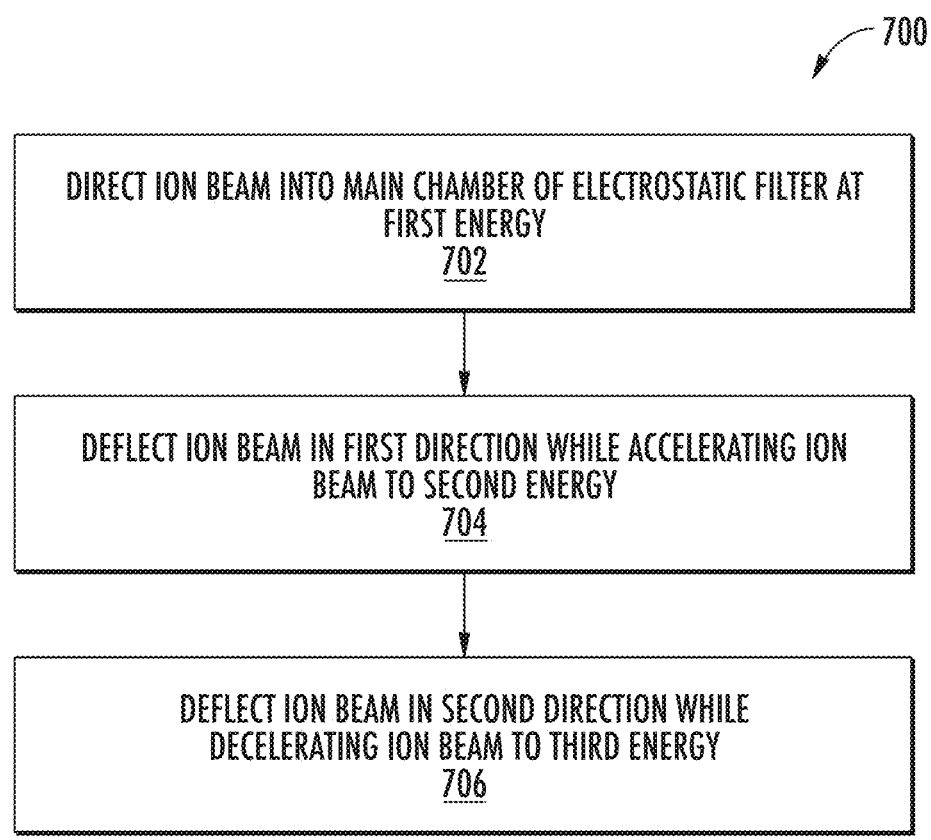
FIG. 7 depicts an exemplary process flow according to some embodiments of the disclosure.

FIG. 7 illustrates an exemplary process flow 700. At block 702, an ion beam is directed into main chamber of an electrostatic filter at a first energy. The ion beam may be directed through an entrance tunnel. At block 704, the ion beam may be deflected in a first direction while being accelerated to a second energy. At block 706, the ion beam may be deflected along a second direction, opposite the first direction while being decelerated to a third energy. The deflection of the ion beam may take place using an electrostatic assembly having electrodes positioned wherein the electrodes are not arranged in a line of sight from a substrate, disposed downstream of the electrostatic filter.

In view of the foregoing, at least the following advantages are achieved by the embodiments disclosed herein. The present embodiments provide a first advantage in that direct contamination of a substrate from an electrostatic filter is reduced by eliminating the ability for negatively charged particles generated the filter electrodes from striking the substrate. In addition, another advantage provided by the present embodiments is the elimination of indirect substrate contamination resulting from accumulation of resputtered material from the substrate on electrodes of the electrostatic filter, resulting in an additional contamination source do to subsequent sputtering or flaking from the electrodes. A further advantage is the low beam bend configuration of the electrostatic filter, providing for facile incorporation in ion implanter beamlines designed for low beam bend architecture near the substrate.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. An apparatus, comprising:
   a main chamber;
   an entrance tunnel, the entrance tunnel having an entrance axis extending into the main chamber;
   an exit tunnel, connected to the main chamber and defining an exit axis, wherein the entrance tunnel and the exit tunnel define a beam bend of less than 25 degrees therebetween; and
   an electrode assembly, disposed in the main chamber, and defining a beam path between the entrance tunnel and the exit tunnel,
   wherein the electrode assembly comprises an upper electrode, disposed on a first side of the beam path, and a plurality of lower electrodes, disposed on a second side of the beam path, the plurality of lower electrodes comprising at least three electrodes, wherein a lower surface of the exit tunnel extends along a first plane, parallel to the beam path, wherein the electrode assembly is disposed entirely below the first plane, and wherein no electrodes within the main chamber are disposed above the first plane.

2. The apparatus of claim 1, wherein the electrode assembly comprises just one upper electrode.

3. The apparatus of claim 1, wherein the upper electrode comprises an elongated cross-section.

4. The apparatus of claim 1, wherein the electrode assembly is disposed just on a lower side of the exit tunnel.

5. The apparatus of claim 1, wherein the upper electrode is disposed at a first distance below the exit tunnel, and wherein a last electrode of the plurality of lower electrodes is disposed at a second distance below the exit tunnel, less than the first distance.

6. The apparatus of claim 1, wherein the entrance tunnel comprises and upper portion and a lower portion, wherein the lower portion extends into the main chamber to a further extent than the upper portion.

7. The apparatus of claim 6, wherein the lower portion comprises a distal end, disposed in the main chamber, the distal end comprising a rounded surface.

8. A method of controlling an ion beam, comprising:
providing an apparatus comprising a main chamber; an entrance tunnel, the entrance tunnel having an entrance axis extending into the main chamber; an exit tunnel, connected to the main chamber and defining an exit axis, wherein the entrance tunnel and the exit tunnel define a beam bend of less than 25 degrees therebetween; and an electrode assembly, disposed in the main chamber, and defining a beam path between the entrance tunnel and the exit tunnel, wherein the electrode assembly comprises an upper electrode, disposed on a first side of the beam path, and a plurality of lower electrodes, disposed on a second side of the beam path, the plurality of lower electrodes comprising at least three electrodes, wherein a lower surface of the exit tunnel extends along a first plane, parallel to the beam path, wherein the electrode assembly is disposed entirely below the first plane, and wherein no electrodes within the main chamber are disposed above the first plane;
conducting the ion beam into the chamber along a first beam trajectory, the ion beam being at a first potential;
deflecting the ion beam in a first direction, while accelerating the ion beam to a second potential; and
deflecting the ion beam in a second direction, opposite the first direction, while decelerating the ion beam to a third potential, wherein the ion beam exits the chamber along a second beam trajectory, different from the first beam trajectory.

9. The method of claim 8, wherein the first beam trajectory and the second beam trajectory define a beam bend of 25 degrees or less.

10. The method of claim 8, wherein the third potential is less than the first potential.

11. The method of claim 8, wherein the deflecting the ion beam in the first direction and the deflecting the ion beam in the second direction comprises deflecting the ion beam using an electrode assembly, the electrode assembly comprising an upper electrode and a plurality of lower electrodes.

12. The method of claim 11, wherein the ion beam comprises a ribbon ion beam, wherein the electrode assembly comprises a plurality of rods, extending along an electrode axis, the electrode axis being oriented perpendicularly to a direction of propagation of the ion beam.

13. The method of claim 11, further comprising conducting the ion beam from the chamber along an exit tunnel to a substrate, wherein the electrode assembly is disposed below the exit tunnel.

14. The method of claim 13, further comprising intercepting energetic neutrals entering the chamber in the exit tunnel, wherein the energetic neutrals do not strike the substrate.

15. The method of claim 13, further comprising intercepting sputtered particles from the substrate, within the chamber, wherein the sputtered particles do not strike the electrode assembly.

16. The method of claim 13, further comprising setting the exit tunnel and chamber walls of the chamber at ground potential, wherein negatively charged particles, emitted from the electrode assembly, are intercepted by the exit tunnel and the chamber walls, and wherein the negatively charged particles do not strike the substrate.

17. An ion implanter, comprising
an ion source to generate an ion beam; and
an electrostatic filter, disposed downstream to the ion source, to control the ion beam, the electrostatic filter comprising:
an entrance tunnel, the entrance tunnel having an entrance axis extending into a main chamber of the electrostatic filter;
an exit tunnel, connected to the main chamber and defining an exit axis, wherein the entrance tunnel and the exit tunnel define a beam bend of less than 25 degrees therebetween; and
an electrode assembly, disposed in the main chamber, and defining a beam path between the entrance tunnel and the exit tunnel, wherein the electrode assembly is disposed on a lower side of the entrance tunnel, wherein a lower surface of the exit tunnel extends along a first plane, parallel to the beam path, wherein the electrode assembly is disposed entirely below the first plane, and wherein no electrodes within the main chamber are disposed above the first plane.

18. The ion implanter of claim 17,
wherein the electrode assembly comprises an upper electrode, disposed on a first side of the beam path, and a plurality of lower electrodes, disposed on a second side of the beam path.

19. The ion implanter of claim 17, further comprising a plasma flood gun, disposed adjacent to the main chamber, wherein the plasma flood gun includes at least a portion of the exit tunnel.

* * * * *